(12) United States Patent
Matsuoka et al.

(10) Patent No.: US 7,106,775 B2
(45) Date of Patent: Sep. 12, 2006

(54) SEMICONDUCTOR LASER DEVICES

(75) Inventors: Hiromasu Matsuoka, Itami (JP); Yasuhiro Kunitsugu, Tokyo (JP); Harumi Nishiguchi, Tokyo (JP); Tetsuya Yagi, Tokyo (JP); Yasuyuki Nakagawa, Tokyo (JP); Junichi Horie, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 244 days.

(21) Appl. No.: 10/791,889

(22) Filed: Mar. 4, 2004

(65) Prior Publication Data

US 2004/0190576 A1    Sep. 30, 2004

(30) Foreign Application Priority Data

Mar. 27, 2003  (JP) .............................. 2003-088905

(51) Int. Cl.
*H01S 5/00* (2006.01)
(52) U.S. Cl. .................................. 372/49.01
(58) Field of Classification Search ............. 372/49.01
See application file for complete search history.

(56) References Cited

U.S. PATENT DOCUMENTS 4,925,259 A    5/1990 Emmett
4,975,922 A    12/1990 Sakane et al.
6,020,992 A    2/2000 Georgiev et al.
6,628,689 B1 *  9/2003 Okada et al. ............ 372/49.01

FOREIGN PATENT DOCUMENTS

| JP | 3-145175 | 6/1991 |
| JP | 4-18784 | 1/1992 |
| JP | 6-204609 | 7/1994 |
| JP | 10-247756 | 9/1998 |
| JP | 2001-77456 | 3/2001 |
| JP | 2002-100830 | 4/2002 |
| JP | 2002-223030 | 8/2002 |

OTHER PUBLICATIONS

Buch: "Laser Spectroscopy", W. Demtroder, Springer Verlag, (1981), pp. 160-165.

* cited by examiner

*Primary Examiner*—Minsun Harvey
*Assistant Examiner*—Marcia A. Golub
(74) *Attorney, Agent, or Firm*—Leydig, Voit & Mayer, Ltd.

(57) ABSTRACT

A low reflective film is formed of, in sequence from a side in contact with a laser chip, a first dielectric film of a refractive index n1 and a thickness d1, a second dielectric film of a refractive index n2 and a thickness d2, a third dielectric film of a refractive index n3 and a thickness d3, and a fourth dielectric film of a refractive index n4 and a thickness d4, specifically, aluminum oxide $Al_2O_3$ with a refractive index n1=1.638 is used for the first dielectric film, silicon oxide $SiO_2$ with a refractive index n2=n4=1.489 for the second and fourth dielectric films, tantalum oxide $Ta_2O_5$ with a refractive index n3=2.063 for the third dielectric film, respectively, resulting in a semiconductor laser device with a reflectance which is stably controllable.

18 Claims, 16 Drawing Sheets

SEMICONDUCTOR LASER DEVICES

BACKGROUND OF THE INVENTION

1. Field of the Invention

The present invention relates to a semiconductor laser device which has a dielectric reflective film on a optical exit face.

2. Description of the Related Art

In a semiconductor laser, a dielectric film is generally formed on an end face of a resonator obtained by wafer cleavage. A reflectance controllable film having a desired reflectance can be formed by choosing arbitrarily sorts, thicknesses and numbers of layers for the dielectric film formed on the end face. For example, the lower reflectance of the front end face and the higher reflectance of the rear end face may produce the higher output power.

However, it is not always enough to lower the reflectance of the front end face, and it is necessary to select the reflectance according to application, i.e., characteristics on demand of the semiconductor laser.

In the semiconductor laser of high output type, for example, the reflectance of the optical exit front end face is approximately 3% to 15%. In case the reflectance of 7% is sought, controllability of the reflectance is needed within 6%±1%. Usually, the reflectance of the front end face which emits laser light in the semiconductor laser is controlled by the thickness and the refractive index of a single dielectric film such as $Al_2O_3$, $SiO_2$, etc.

FIG. 23 is a structural drawing showing an example of a conventional semiconductor laser device. A laser chip comprises a semiconductor substrates 1, such as GaAs, an active layer 2, cladding layers 3 formed above and below the active layer 2, and electrodes 4 formed above and below the cladding layers 3.

A semiconductor laser device comprises the laser chip noted above, a low reflective film 8 formed on a front end face of the laser chip, and a high reflective film 9 formed on a rear end face of the laser chip.

In general, for the low reflective film 8 on the front end face, a single layer film having an optical thickness of integral multiple of $\lambda/4\pm\alpha$ using laser oscillation wavelength $\lambda$ in vacuum is used, wherein $\alpha$ is a correction coefficient for controlling a desired reflectance.

The front end face of the semiconductor laser is likely to rise in temperature due to high density of laser light. Therefore, the low reflective film 8 is typically formed of an aluminium oxide film with a thickness of $3*\lambda/4\pm\alpha$ so as to serve as a heat dispersing plate (heat spreader).

FIG. 24 is a graph showing an example of reflectance of the conventional low reflective film with the wavelength dependency. FIG. 25 is a graph showing an example of reflectance of the conventional low reflective film with the thickness dependency. Here, for the low reflective film 8, an aluminium oxide film with a thickness of 318.9 nm ($\alpha$=+17 nm) is formed on the front end face of a red semiconductor laser with an oscillation wavelength $\lambda$=660 nm. Incidentally, the equivalent refractive index of the laser chip is 3.817.

Referring to the graph of FIG. 25, when the reflectance of the low reflective film 8 is controlled within 6%±1%, it is seen that the thickness of the low reflective film 8 must be controlled with an accuracy of ±1%, i.e., nearly ±3 nm with respect to the design value of thickness da =318.9 nm. Such an accuracy of thickness is difficult to obtain by means of vacuum evaporation or sputtering which is generally used for forming an optical thin film, resulting in a lower yield of manufacturing a semiconductor laser.

The related prior arts are listed as follows: Japanese Patent Unexamined Publication JP-2001-77456-A (2001), and Japanese Patent Publication JP-3080312-B (2000).

However, in case of attaining the low reflective film 8 having a reflectance within 6%±1%, for example, variation in thickness of the single layer film of aluminium oxide must be limited within ±1%, resulting in the stricter controllability of reflectance and lower yield of manufacture.

SUMMARY OF THE INVENTION

The purpose of the present invention is to provide a semiconductor laser device with a reflectance which is stably controllable, despite variation of thickness and refractive index of a dielectric film constituting a reflective film on an end face of the laser chip, and with a desired reflectance which is easily to attain for applications of the laser device.

A semiconductor laser device according to the present invention comprises: a reflective film constituted of multilayer dielectric films, being provided on at least one side of optical exit faces of a laser chip; wherein the reflective film includes, in sequence from a side in contact with the laser chip, a first dielectric film of a refractive index n1, a second dielectric film of a refractive index n2, a third dielectric film of a refractive index n3 and a fourth dielectric film of a refractive index n4, and each of refractive indices satisfies a relation: n2=n4<n1<n3 or a relation: n2=n4<n3<n1.

In such a configuration, the wavelength dependency and the thickness dependency of the reflectance of the multilayer dielectric film can become smaller. Consequently, a desired reflectance can be easily realized in accordance with applications of the laser device, and the yield of manufacturing the semiconductor laser device can be enhanced.

DETAILED DESCRIPTION OF THE PREFERRED EMBODIMENTS

This application is based on an application No. 2003-88905 filed Mar. 27, 2003 in Japan, the disclosure of which is incorporated herein by reference.

Hereinafter, preferred embodiments will be described with reference to drawings.

Embodiment 1

Figure 1:
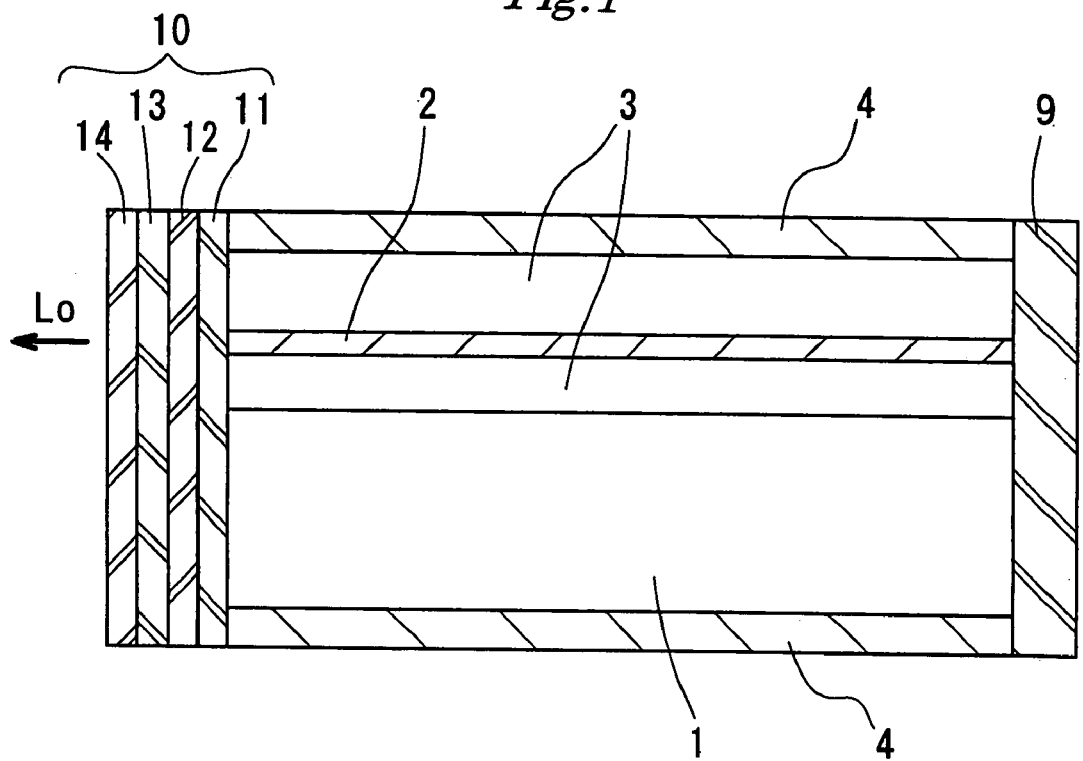
FIG. 1 is a structural drawing showing a first embodiment of the present invention.
Figure 23:
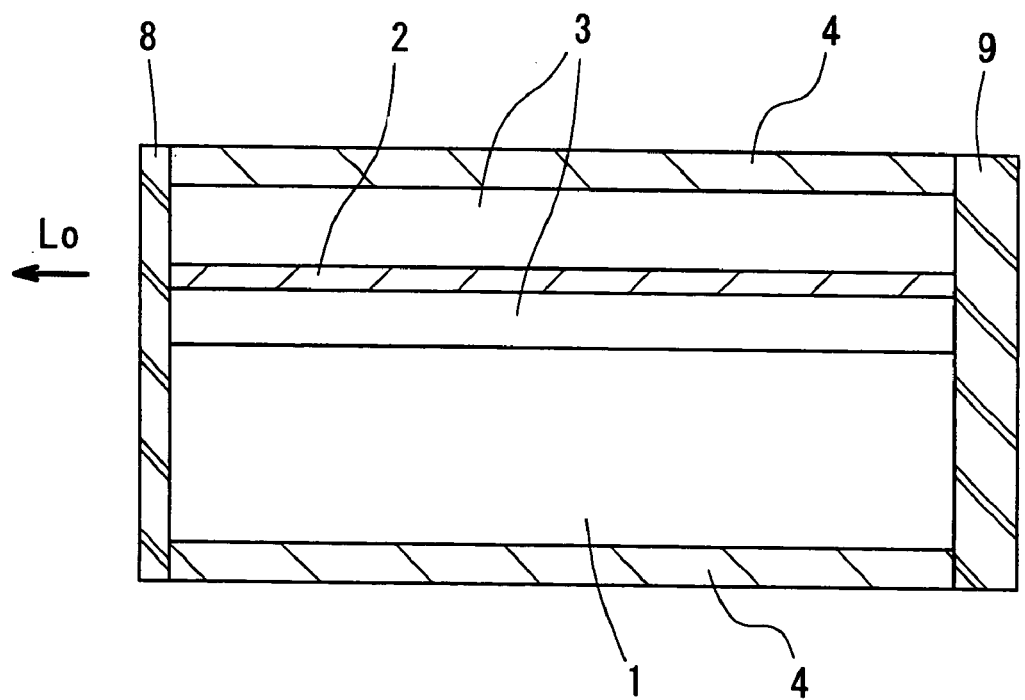
FIG. 23 is a structural drawing showing an example of a conventional semiconductor laser device.

FIG. 1 is a structural drawing showing a first embodiment of the present invention, illustrated as a vertical sectional view along with an optical axis. A laser chip comprises a semiconductor substrates 1, such as GaAs, an active layer 2, cladding layers 3 formed above and below the active layer 2, and electrodes 4 formed above and below the cladding layers 3.

A semiconductor laser device comprises the laser chip noted above, a low reflective film 10 formed on a front end face of the laser chip, and a high reflective film 9 formed on a rear end face of the laser chip.

The low reflective film 10 is formed of, in sequence from a side in contact with the laser chip, a dielectric film 11 of a refractive index n1 and a thickness d1, a dielectric film 12 of a refractive index n2 and a thickness d2, a dielectric film 13 of a refractive index n3 and a thickness d3, and a dielectric film 14 of a refractive index n4 and a thickness d4.

In this embodiment, materials of the dielectric films 12 and 14 are so selected that the refractive index n2 of the dielectric film 12 and the refractive index n4 of the dielectric film 14 are equal to each other, and material of the dielectric film 11 is so selected that the refractive index n1 of the dielectric film 11 is greater than the refractive index n2(=n4), and material of the dielectric film 13 is so selected that the refractive index n3 of the dielectric film 13 is greater than the refractive index n1. Namely, each of refractive indices n1 to n4 of the dielectric films 11 to 14 satisfies a relation: $n2=n4<n1<n3$.

Exemplifying a typical configuration of the low reflective film 10, in case of using a red semiconductor laser (equivalent refractive index: 3.817) with an oscillation wavelength $\lambda=660$ nm, aluminum oxide $Al_2O_3$ with a refractive index $n1=1.638$ is used for the dielectric film 11, silicon oxide $SiO_2$ with a refractive index $n2=n4=1.489$ for the dielectric films 12 and 14, tantalum oxide $Ta_2O_5$ with a refractive index $n3=2.063$ for the dielectric film 13, respectively.

Furthermore, each thickness d1 to d4 of the dielectric films 11 to 14 is designed, in terms of optical length, to be ¼ oscillation wavelength, i.e., $\lambda/4$. Specifically,. thickness d1 of the dielectric film 11 is equal to 100.7 nm, thickness d2 of the dielectric film 12 is equal to 110.8 nm, thickness d3 of the dielectric film 13 is equal to 80.0 nm, thickness d4(=d2) of the dielectric film 14 is equal to 110.8 nm, respectively.

In such a configuration, the low reflective film 10 has a reflectance of 6% at oscillation wavelength $\lambda=660$ nm.

Figure 2:
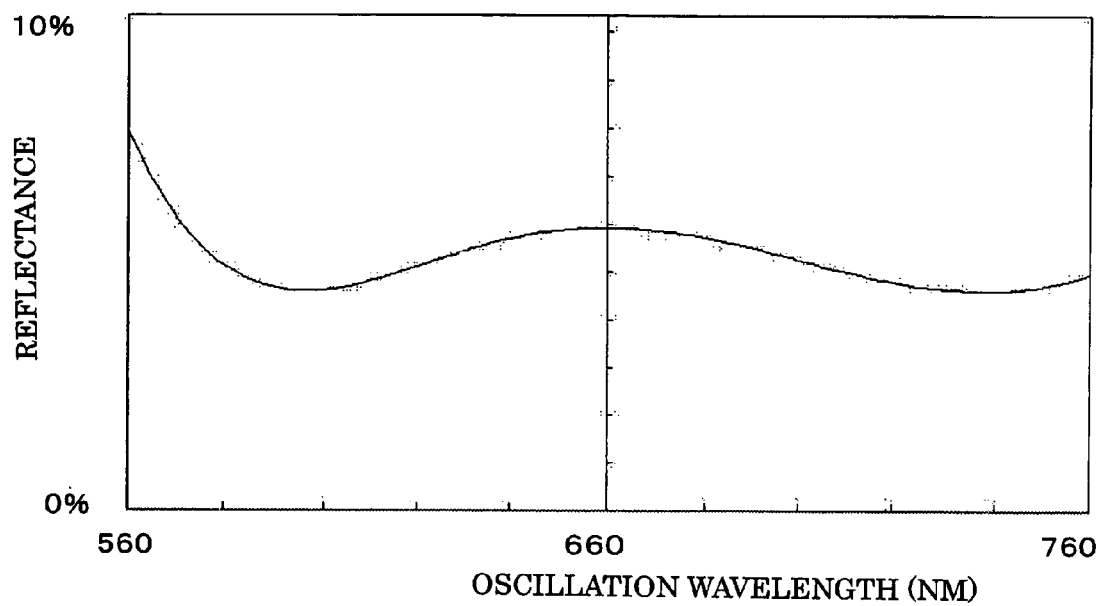
FIG. 2 is a graph showing the reflectance of the low reflective film 10 with the wavelength dependency.
Figure 24:
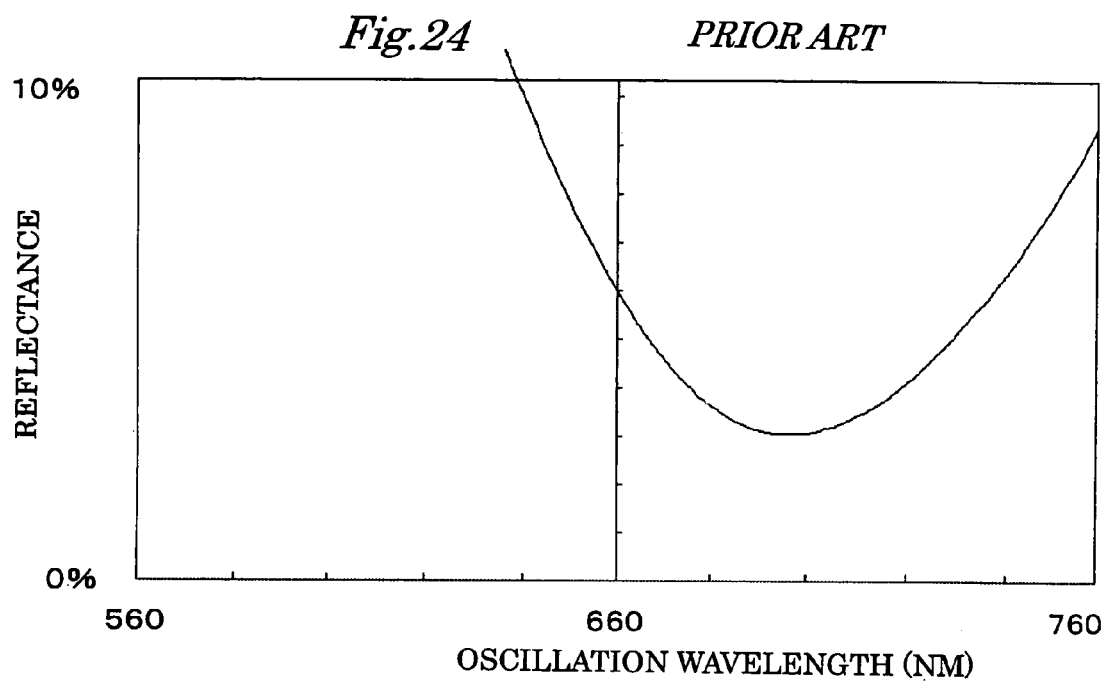
FIG. 24 is a graph showing an example of reflectance of a conventional low reflective film with the wavelength dependency.

FIG. 2 is a graph showing the reflectance of the low reflective film 10 with the wavelength dependency. This graph shows a reflectance of 6% at the center wavelength $\lambda=660$ nm, where variation of the reflectance versus change of the oscillation wavelength becomes significantly smaller, compared with the graph of FIG. 24. Therefore, it is seen that the low reflective film 10 has a stable reflectance even if the oscillation wavelength of laser deviates.

Figure 3:
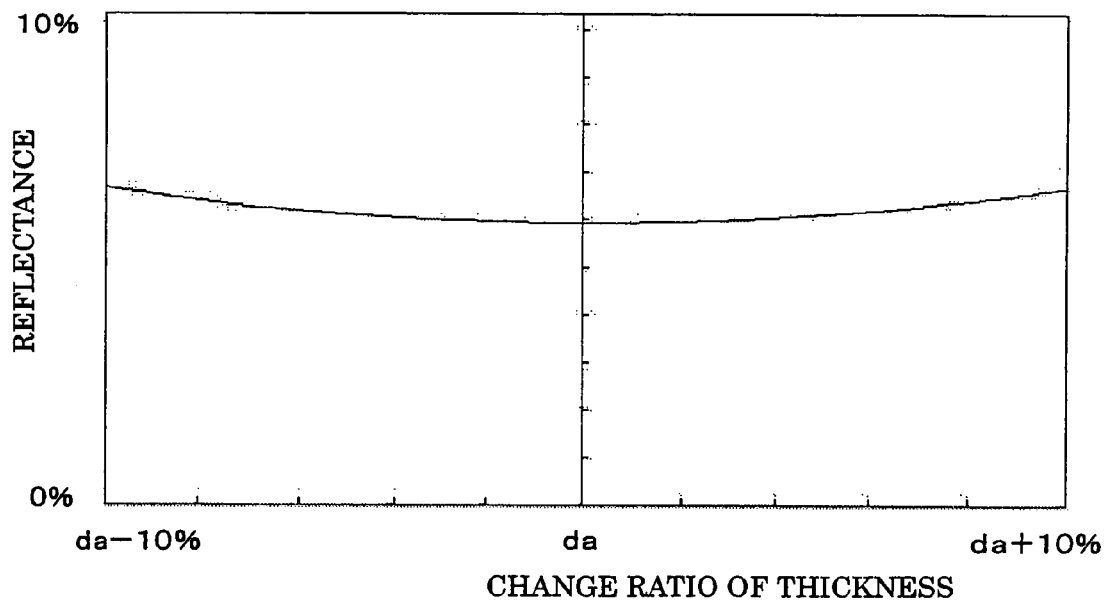
FIG. 3 is a graph showing the reflectance of the low reflective film 10 with the dependency on the thickness of the first dielectric film 11.
Figure 4:
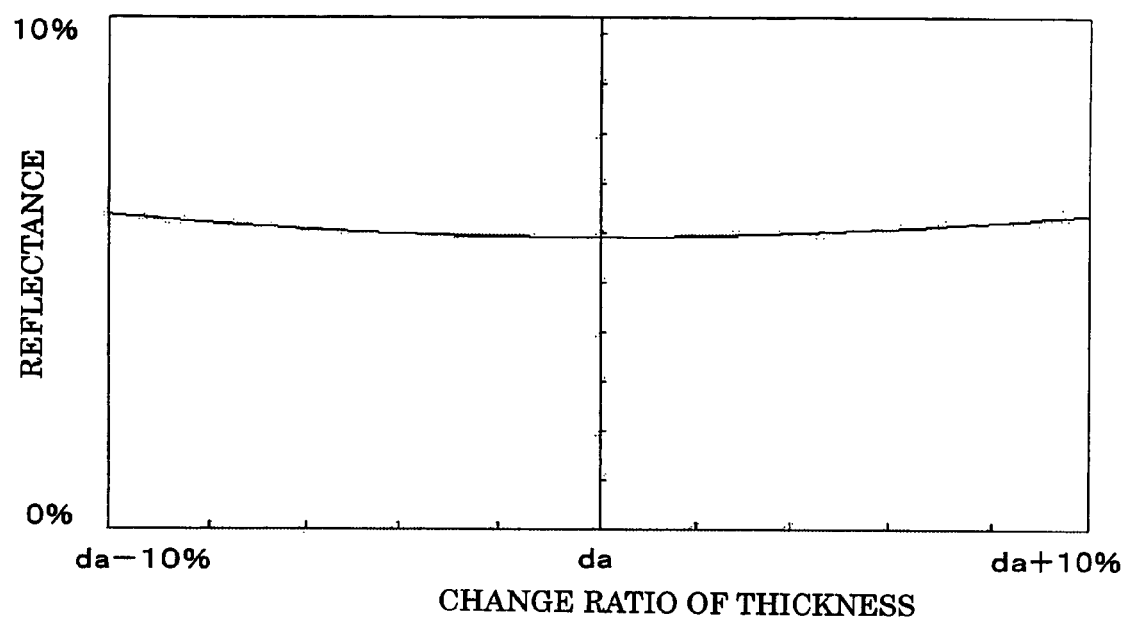
FIG. 4 is a graph showing the reflectance of the low reflective film 10 with the dependency on the thickness of the second dielectric film 12.
Figure 5:
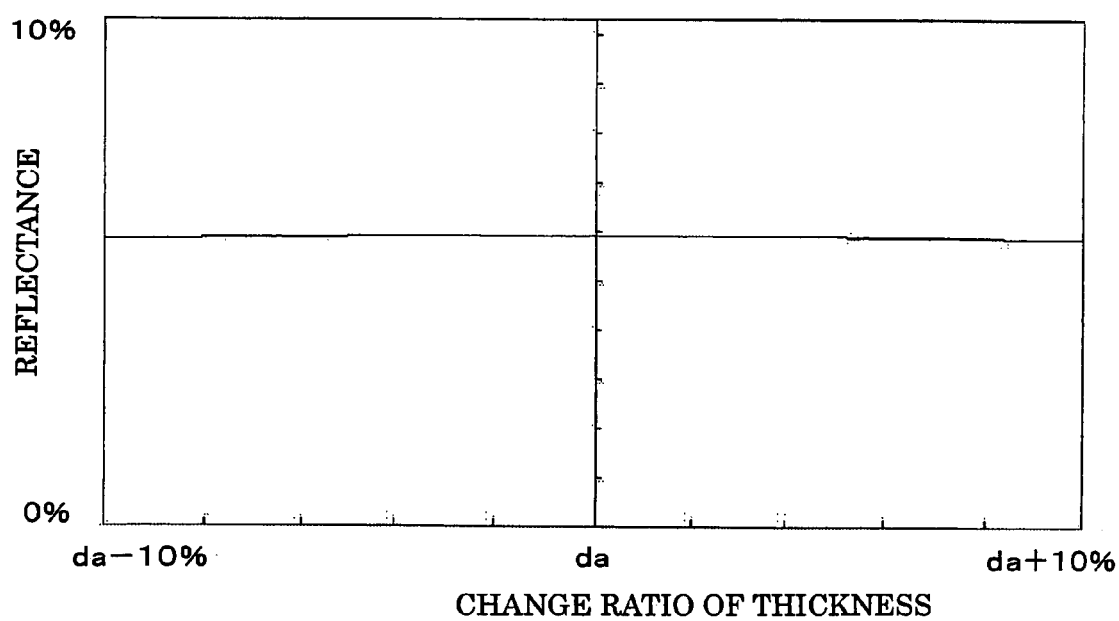
FIG. 5 is a graph showing the reflectance of the low reflective film 10 with the dependency on the thickness of the third dielectric film 13.
Figure 6:
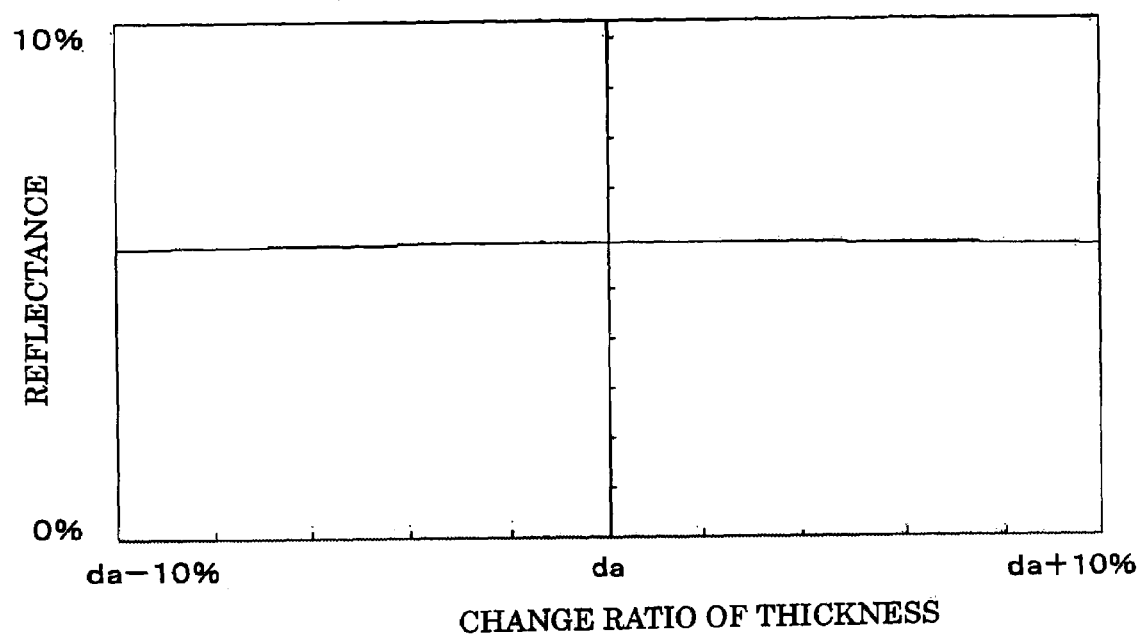
FIG. 6 is a graph showing the reflectance of the low reflective film 10 with the dependency on the thickness of the fourth dielectric film 14.

FIG. 3 is a graph showing the reflectance of the low reflective film 10 with the dependency on the thickness of the first dielectric film 11. FIG. 4 is a graph showing the reflectance of the low reflective film 10 with the dependency on the thickness of the second dielectric film 12. FIG. 5 is a graph showing the reflectance of the low reflective film 10 with the dependency on the thickness of the third dielectric film 13. FIG. 6 is a graph showing the reflectance of the low reflective film 10 with the dependency on the thickness of the fourth dielectric film 14.

Figure 25:
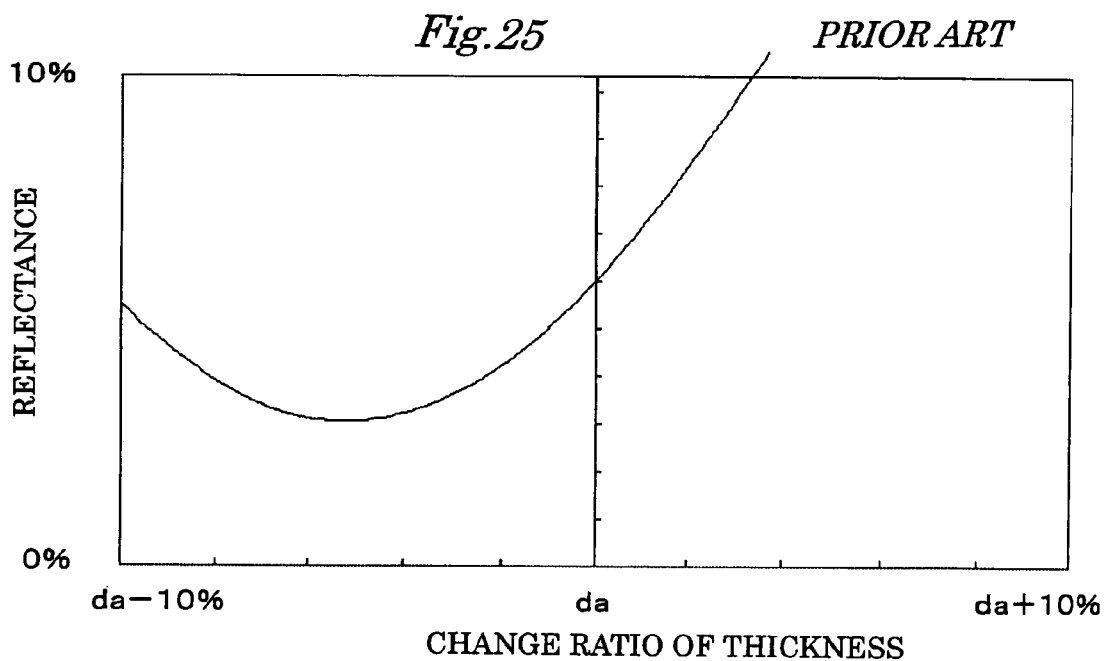
FIG. 25 is a graph showing an example of reflectance of the conventional low reflective film with the thickness dependency.

Each of these graphs shows a reflectance of 6% at each design value of thickness da, where variation of the reflectance versus change of the thickness of each dielectric film becomes significantly smaller, compared with the graph of FIG. 25. The reflectance of the low reflective film 10 hardly changes even if each of thicknesses d1 to d4 deviates within ±10% of range with respect to each design value of thickness da. Therefore, it is seen that variation of the reflectance can be suppressed within 0.3% at most.

In another case the low reflective film 10 acquires a reflectance of 7% at oscillation wavelength $\lambda=660$ nm, in the same way as described above, aluminum oxide $Al_2O_3$ with a refractive index $n1=1.638$ is used for the dielectric film 11, silicon oxide $SiO_2$ with a refractive index $n2=n4=1.489$ for the dielectric films 12 and 14, tantalum oxide $Ta_2O_5$ with a refractive index $n3=2.063$ for the dielectric film 13, respectively. And each thickness of the dielectric films is designed as d1=100.7 nm, d2=d4=100.0 nm, and d3=100.0 nm, respectively.

Figure 7:
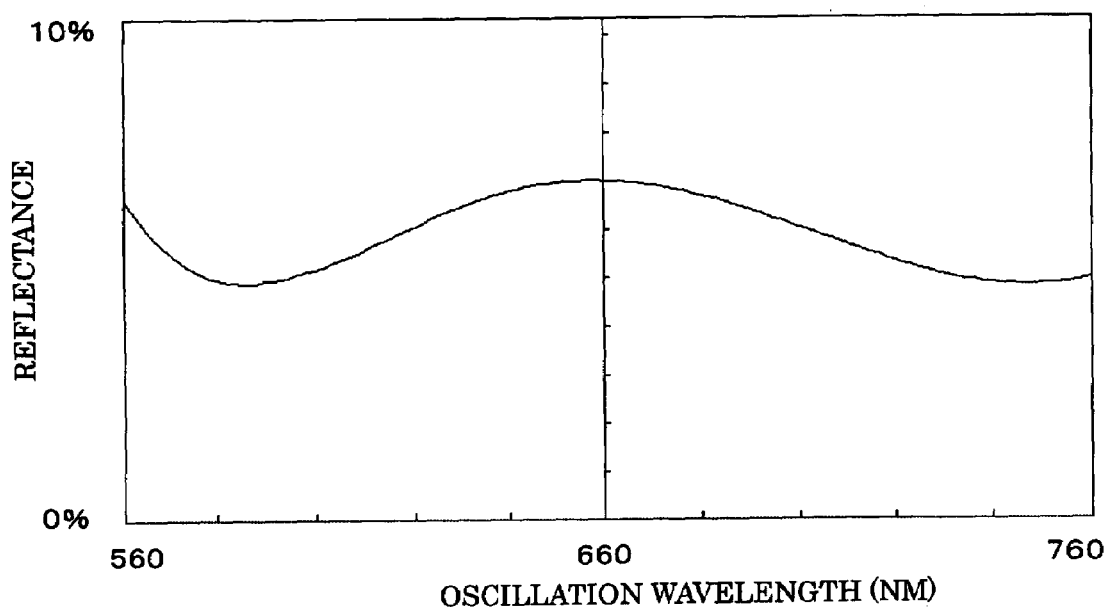
FIG. 7 is a graph showing the reflectance of the low reflective film 10 with the wavelength dependency.

FIG. 7 is a graph showing the reflectance of the low reflective film 10 with the wavelength dependency. This graph shows a reflectance of 7% at the center wavelength λ=660 nm, where variation of the reflectance versus change of the oscillation wavelength becomes significantly smaller, compared with the graph of FIG. 24. Therefore, it is seen that the low reflective film 10 has a stable reflectance even if the oscillation wavelength of laser deviates.

Figure 8:
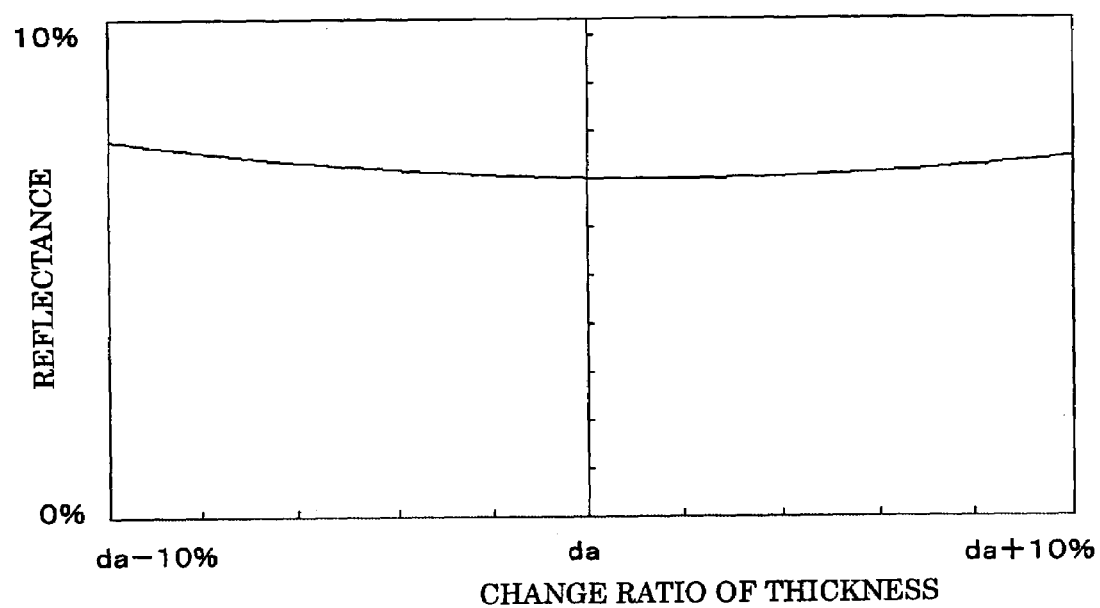
FIG. 8 is a graph showing the reflectance of the low reflective film 10 with the dependency on the thickness of the first dielectric film 11.
Figure 9:
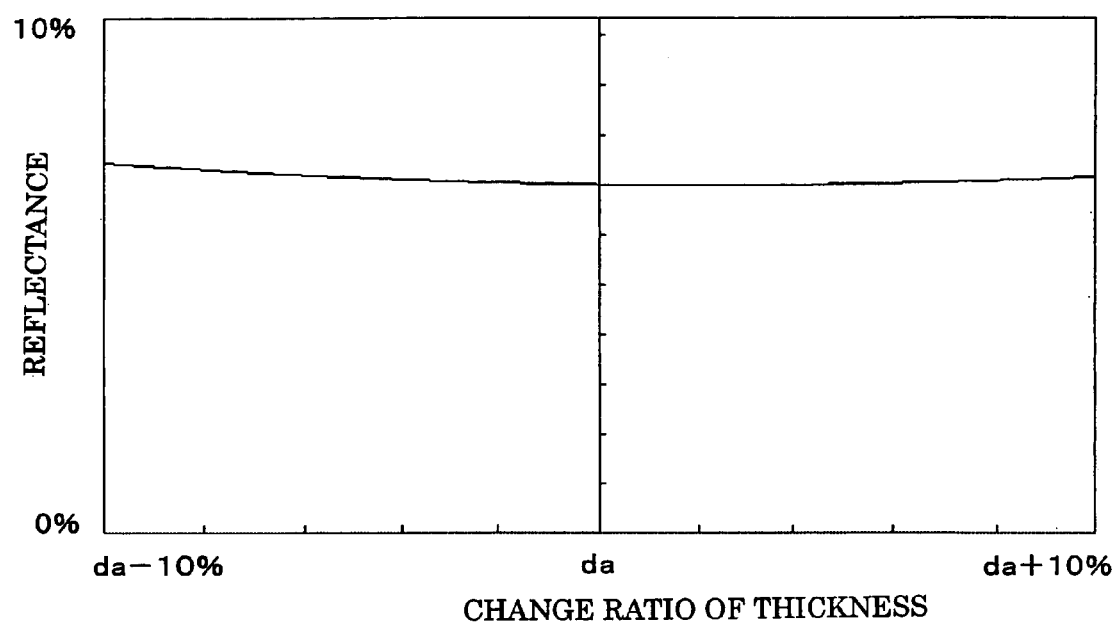
FIG. 9 is a graph showing the reflectance of the low reflective film 10 with the dependency on the thickness of the second dielectric film 12.
Figure 10:
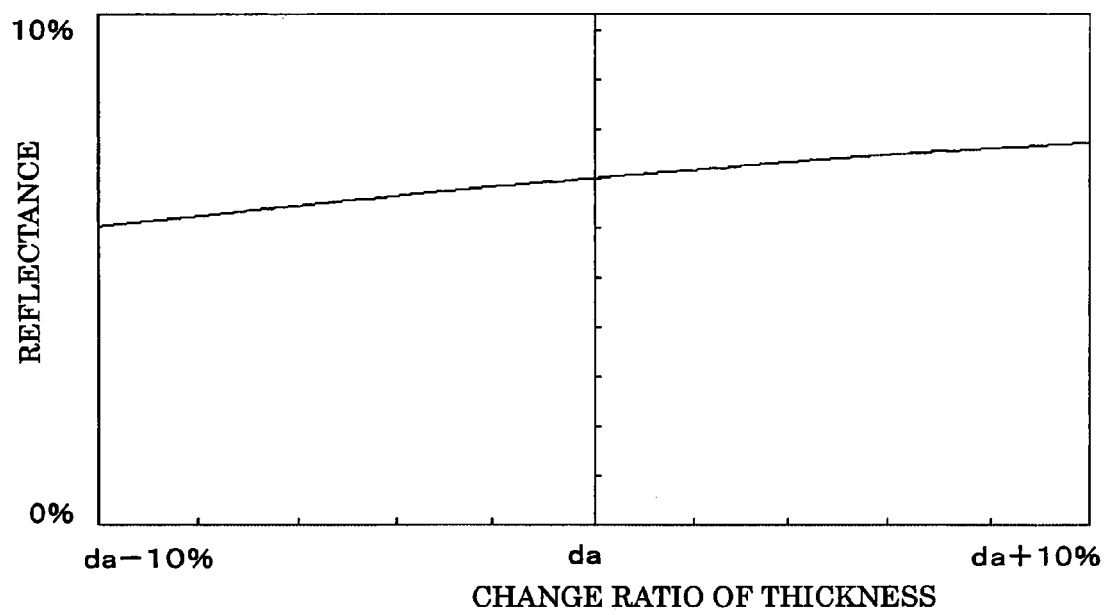
FIG. 10 is a graph showing the reflectance of the low reflective film 10 with the dependency on the thickness of the third dielectric film 13.
Figure 11:
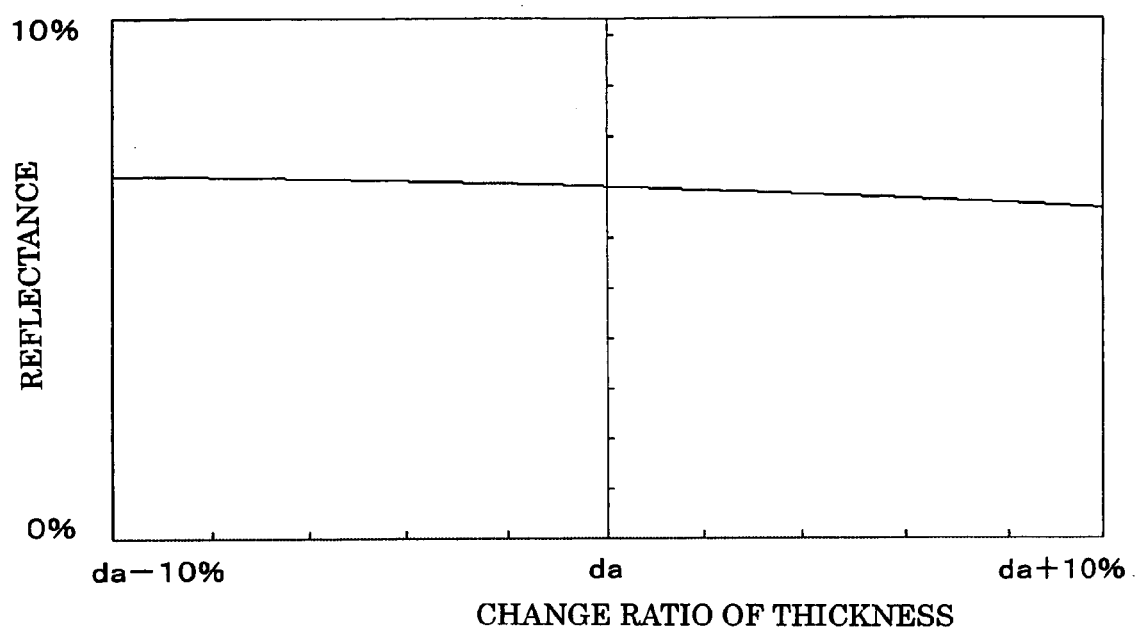
FIG. 11 is a graph showing the reflectance of the low reflective film 10 with the dependency on the thickness of the fourth dielectric film 14.

FIG. 8 is a graph showing the reflectance of the low reflective film 10 with the dependency on the thickness of the first dielectric film 11. FIG. 9 is a graph showing the reflectance of the low reflective film 10 with the dependency on the thickness of the second dielectric film 12. FIG. 10 is a graph showing the reflectance of the low reflective film 10 with the dependency on the thickness of the third dielectric film 13. FIG. 11 is a graph showing the reflectance of the low reflective film 10 with the dependency on the thickness of the fourth dielectric film 14.

Each of these graphs shows a reflectance of 7% at each design value of thickness da, where variation of the reflectance versus change of, the thickness of each dielectric film becomes significantly smaller, compared with the graph of FIG. 25. The reflectance of the low reflective film 10 hardly changes even if each of thicknesses d1 to d4 deviates within ±10% of range with respect to each design value of thickness da. Therefore, it is seen that variation of the reflectance can be suppressed within 0.8% at most.

Thus, when each of refractive indices n1 to n4 of the dielectric films 11 to 14 satisfies a relation: n2=n4<n1<n3, the wavelength dependency and the thickness dependency of the reflectance of the multilayer dielectric film can become smaller, thereby enhancing the yield of manufacturing the semiconductor laser device.

In addition, it is preferable that the refractive index n1 satisfies $1.6<n1\leq1.9$, the refractive index n2 satisfies $1.3\leq n2\leq1.6$, the refractive index n3 satisfies $1.9<n3\leq2.3$, and the refractive index n4 satisfies $1.3\leq n4\leq1.6$, and the thickness d1 is substantially equal to $(2*h+1)\lambda/(4*n1)$, the thickness d2 is substantially equal to $(2*i+1)\lambda/(4*n2)$, the thickness d3 is substantially equal to $(2*j+1)\lambda/(4*n3)$, and the thickness d4 is substantially equal to $(2*k+1)\lambda/(4*n4)$, wherein each of h, i, j and k is zero or more integer. This configuration allows a multilayer dielectric film to be adjusted to a desired reflectance within a range of 3% to 15%.

Moreover, in order that each of refractive indices satisfies the relation: n2=n4<n1<n3, it is preferable that the dielectric film 11 is formed of either of $Al_2O_3$, $CeF_3$, $NdF_3$, MgO and $Y_2O_3$, the dielectric films 12 and 14 are formed of either of $SiO_2$, $MgF_2$, $BaF_2$ and $CaF_2$, and the dielectric film 13 is formed of either of $Ta_2O_5$, SiO, $ZrO_2$, ZnO, TiO, $TiO_2$, ZnS, $Nb_2O_5$, $HfO_2$ and AlN. Usage of these materials facilitates a multilayer dielectric film having a desired reflectance to be realized.

Furthermore, when each of refractive indices n1 to n4 of the dielectric films 11 to 14 satisfies the relation: n2=n4<n1<n3, the reflective film is intended to have a reflectance of 3% to 15% at a desired wavelength by individually adjusting each thickness d1 to d4 within ±30% of range in terms of optical length. Therefore, specifications can be easily modified in accordance with applications of the laser device, and the yield of manufacturing the semiconductor laser device can be enhanced by taking the wavelength dependency and the thickness dependency into consideration.

As mentioned above, the semiconductor laser device which emits laser light of a single oscillation wavelength is described in detail. Such a low reflective film 10 as above can be applied to a laser chip having a plurality of light emitting points which emit two or more different oscillation wavelengths, so called, a multi-beam laser.

For example, a laser chip which can be applied to both standards of DVD (digital videodisc) and CD (compact-disc) can emit one beam with a wavelength of 660 nm and another beam with a wavelength of 780 nm. In this case, a multilayer dielectric film which has desired reflectances at two wavelengths would be needed.

Figure 12:
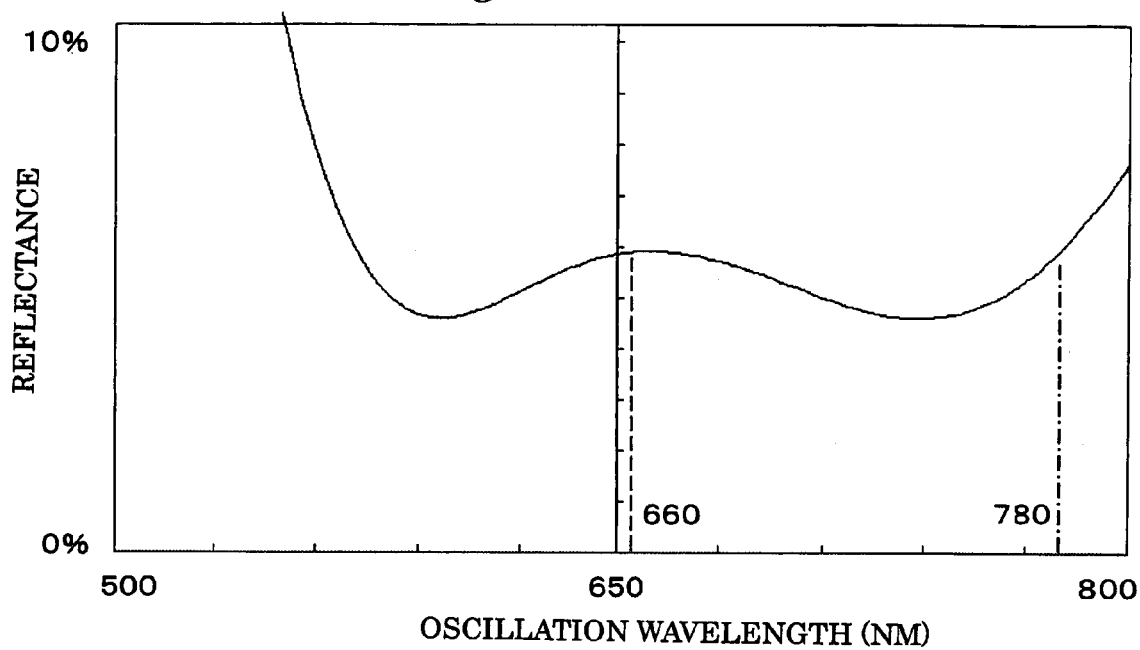
FIG. 12 is a graph showing the reflectance of a multilayer dielectric film which has a reflectance of nearly 6% at two wavelengths with the wavelength dependency.

Then, when each of refractive indices n1 to n4 of the dielectric films 11 to 14 satisfies the relation: n2=n4<n1<n3, the reflective film is intended to have desired reflectances at desired wavelengths by individually adjusting each thickness d1 to d4, in terms of optical length, within ±30% of range of ¼ oscillation wavelength as a center thickness. As shown in FIG. 12, for example, the multilayer dielectric film which has a reflectance of nearly 6% at both 660 nm and 780 nm can be attained.

Furthermore, in case two or more of the above semiconductor laser devices are arranged in a single package, and each of laser chip emits different oscillation wavelength from each other, and each of multilayer dielectric film on the optical exit face of each laser chip is formed of the same material with the same thickness, then, in the same manner as multi-beam laser, the reflective film is intended to have desired reflectances at desired wavelengths by individually adjusting each thickness d1 to d4, in terms of optical length, within ±30% of range of ¼ oscillation wavelength as a center thickness.

Embodiment 2

In this embodiment, configuration of a semiconductor laser device is similar to as shown in FIG. 1. A low reflective film 10 is formed of, in sequence from a side in contact with the laser chip, a dielectric film 11 of a refractive index n1 and a thickness d1, a dielectric film 12 of a refractive index n2 and a thickness d2, a dielectric film 13 of a refractive index n3 and a thickness d3, and a dielectric film 14 of a refractive index n4 and a thickness d4. However, materials of the dielectric films are so selected that each of refractive indices n1 to n4 satisfies a relation: n2=n4<n3<n1.

Exemplifying a typical configuration of the low reflective film 10, in case of using a red semiconductor laser (equivalent refractive index: 3.817) with an oscillation wavelength λ=660 nm, tantalum oxide $Ta_2O_5$ with a refractive index n1=2.063 for the dielectric film 11 which is in contact with the laser chip, silicon oxide $SiO_2$ with a refractive index n2=n4=1.489 for the dielectric films 12 and 14, aluminum oxide $Al_2O_3$ with a refractive index n3=1.638 is used for the dielectric film 13, respectively.

Furthermore, each thickness d1 to d4 of the dielectric films 11 to 14 is designed, in terms of optical length, to be ¼ oscillation wavelength, i.e., λ/4. Specifically, thickness d1 of the dielectric film 11 is equal to 80.0 nm, thickness d2 of the dielectric film 12 is equal to 110.8 nm, thickness d3 of the dielectric film 13 is equal to 100.7 nm, thickness d4(=d2) of the dielectric film 14 is equal to 110.8 nm, respectively.

In such a configuration, the low reflective film 10 has a reflectance of 6% at oscillation wavelength λ=660 nm.

Figure 13:
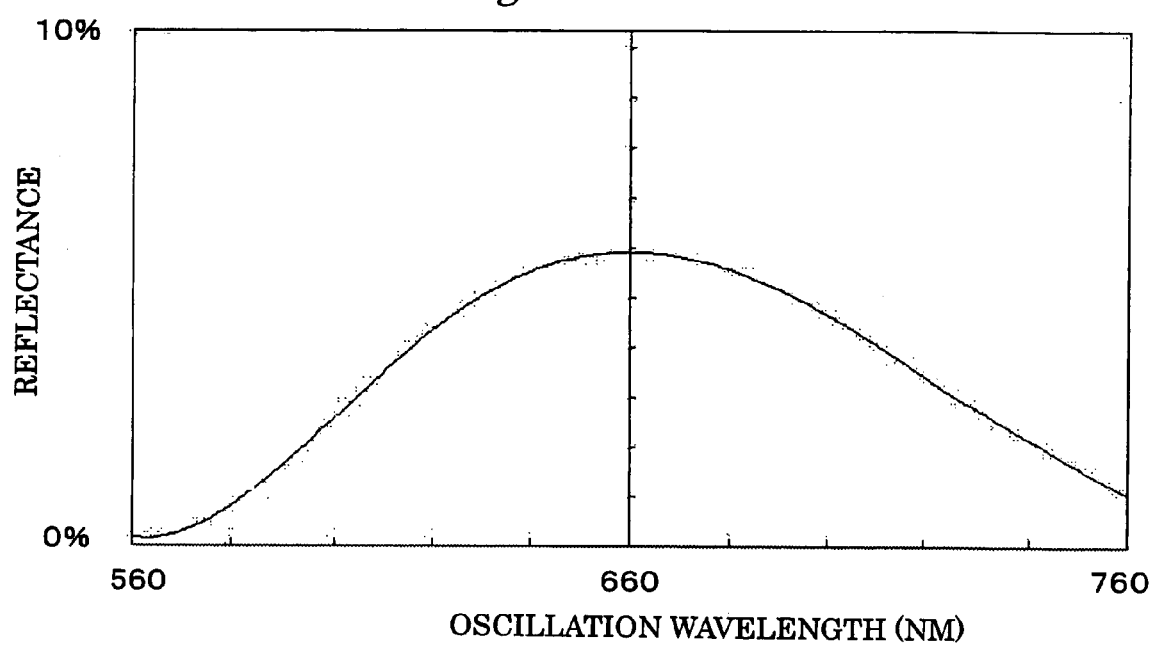
FIG. 13 is a graph showing the reflectance of the low reflective film 10 with the wavelength dependency.

FIG. 13 is a graph showing the reflectance of the low reflective film 10 with the wavelength dependency. This graph shows a reflectance of 6% at the center wavelength λ=660 nm, where variation of the reflectance versus change of the oscillation wavelength becomes significantly smaller, compared with the graph of FIG. 24. Therefore, it is seen that the low reflective film 10 has an stable reflectance even if the oscillation wavelength of laser deviates.

Figure 14:
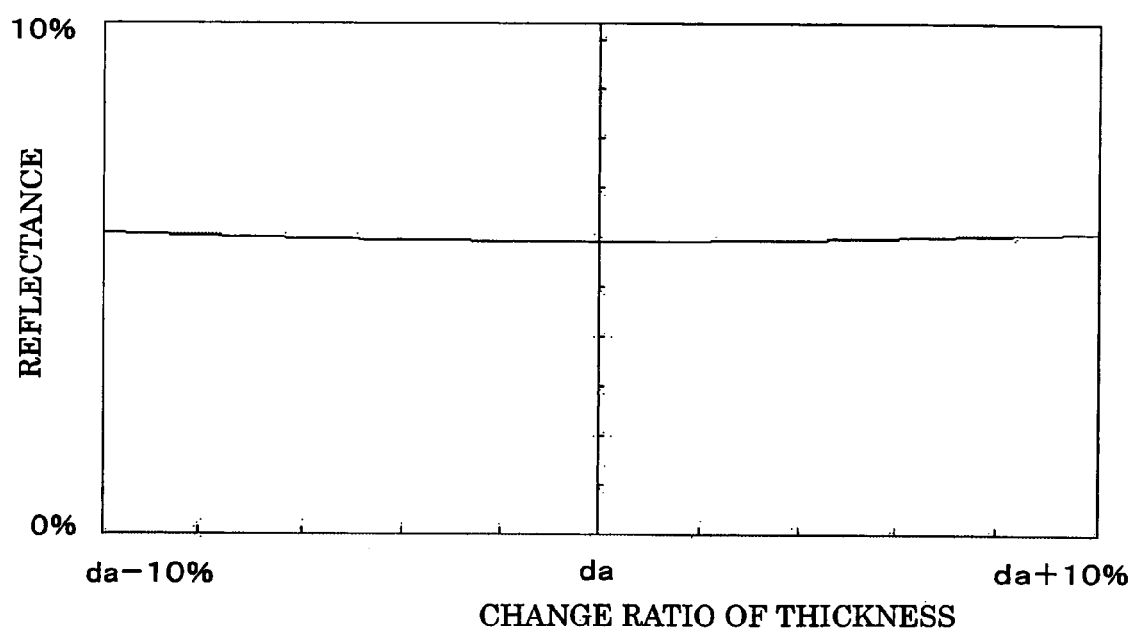
FIG. 14 is a graph showing the reflectance of the low reflective film 10 with the dependency on the thickness of the first dielectric film 11.
Figure 15:
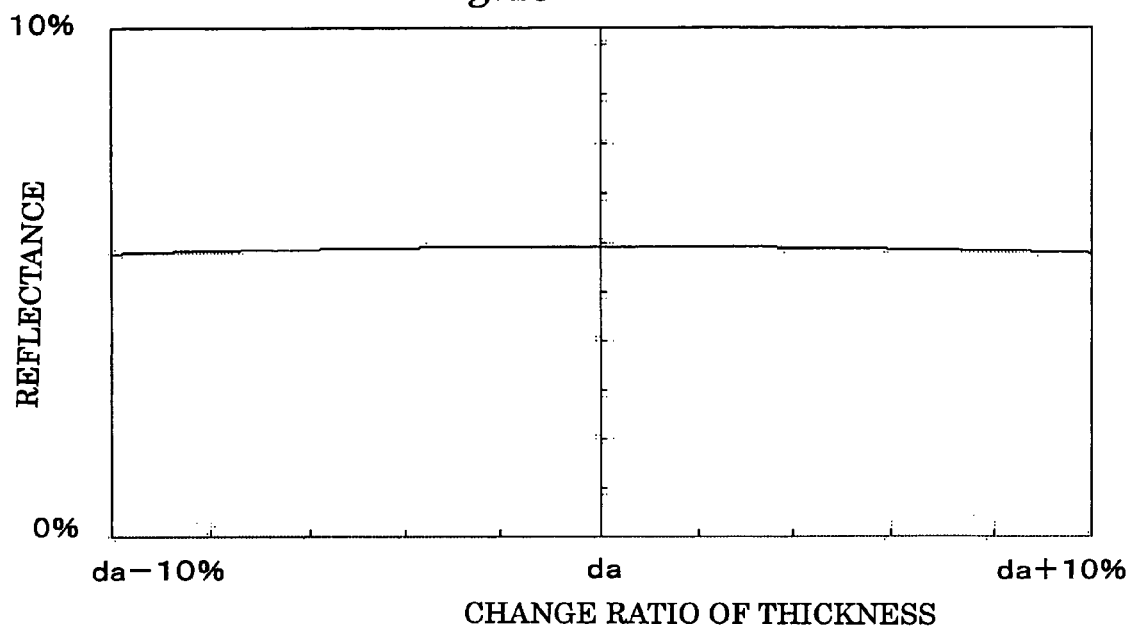
FIG. 15 is a graph showing the reflectance of the low reflective film 10 with the dependency on the thickness of the second dielectric film 12.
Figure 16:
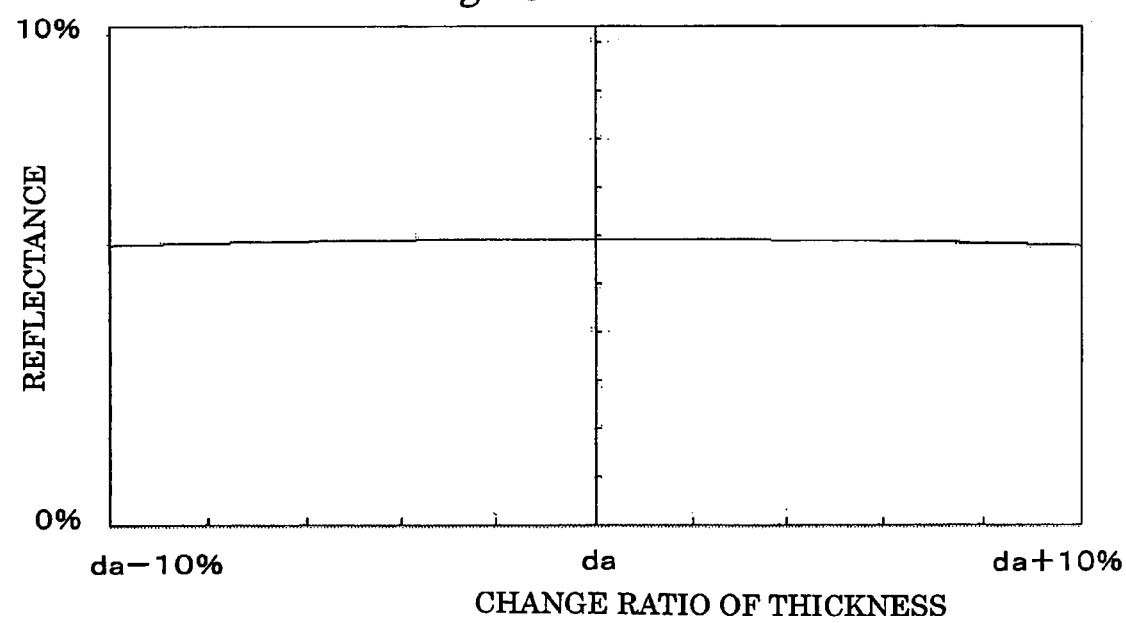
FIG. 16 is a graph showing the reflectance of the low reflective film 10 with the dependency on the thickness of the third dielectric film 13.
Figure 17:
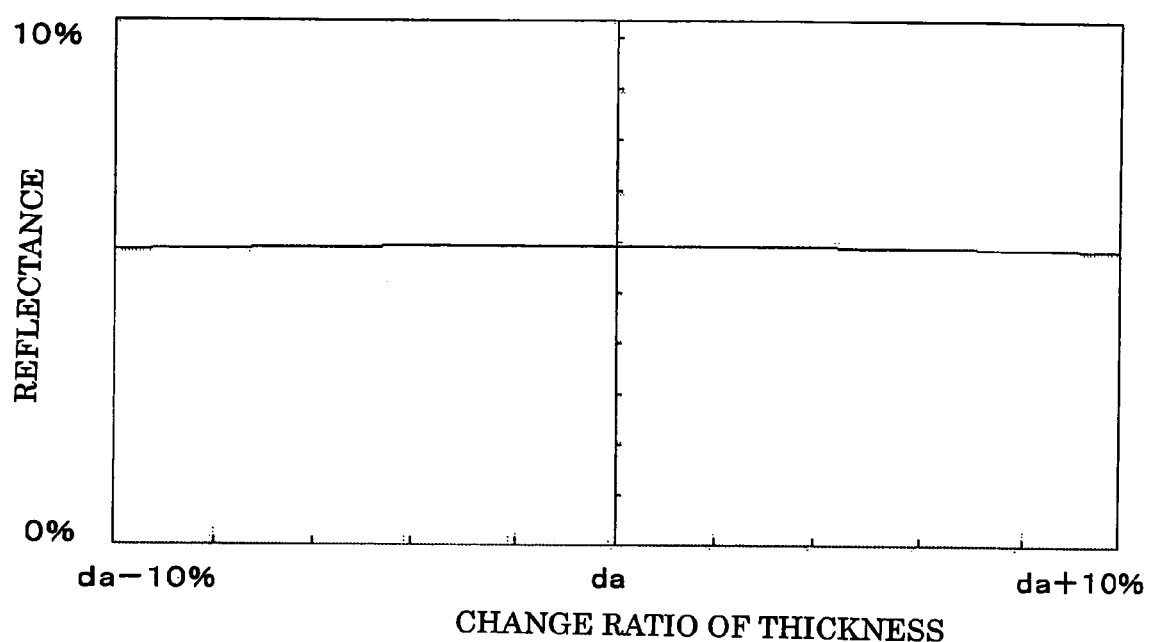
FIG. 17 is a graph showing the reflectance of the low reflective film 10 with the dependency on the thickness of the fourth dielectric film 14.

FIG. 14 is a graph showing the reflectance of the low reflective film 10 with the dependency on the thickness of the first dielectric film 11. FIG. 15 is a graph showing the reflectance of the low reflective film 10 with the dependency on the thickness of the second dielectric film 12. FIG. 16 is a graph showing the reflectance of the low reflective film 10 with the dependency on the thickness of the third dielectric film 13. FIG. 17 is a graph showing the reflectance of the low reflective film 10 with the dependency on the thickness of the fourth dielectric film 14.

Each of these graphs shows a reflectance of 6% at each design value of thickness da, where variation of the reflectance versus change of the thickness of each dielectric film becomes significantly smaller, compared with the graph of FIG. 25. The reflectance of the low reflective film 10 hardly changes even if each of thicknesses d1 to d4 deviates within ±10% of range with respect to each design value of thickness da. Therefore, it is seen that variation of the reflectance can be suppressed within 0.3% at most.

Thus, when each of refractive indices n1 to n4 of the dielectric films 11 to 14 satisfies the relation: n2=n4<n3<n1, the wavelength dependency and the thickness dependency of the reflectance of the multilayer dielectric film can become smaller, thereby enhancing the yield of manufacturing the semiconductor laser device.

In addition, it is preferable that the refractive index n1 satisfies 1.9<n1≦2.3, the refractive index n2 satisfies 1.3≦n2≦1.6, the refractive index n3 satisfies 1.6<n3≦1.9, and the refractive index n4 satisfies 1.3≦n4≦1.6, and the thickness d1 is substantially equal to $(2*h+1)\lambda/(4*n1)$, the thickness d2 is substantially equal to $(2*i+1)\lambda/(4*n2)$, the thickness d3 is substantially equal to $(2*j+1)\lambda/(4*n3)$, and the thickness d4 is substantially equal to $(2*k+1)\lambda/(4*n4)$, wherein each of h, i, j and k is zero or more integer. This configuration allows a multilayer dielectric film to be adjusted to a desired reflectance within a range of 3% to 15%.

Moreover, in order that each of refractive indices satisfies the relation: n2=n4<n3<n1, it is preferable that the dielectric film 11 is formed of either of $Ta_2O_5$, SiO, $ZrO_2$, ZnO, TiO, $TiO_2$, ZnS, $Nb_2O_5$, $HfO_2$ and AlN, the dielectric films 12 and 14 are formed of either of $SiO_2$, $MgF_2$, $BaF_2$ and $CaF_2$, and the dielectric film 13 is formed of either of $Al_2O_3$, $CeF_3$, $NdF_3$, MgO and $Y_2O_3$. Usage of these materials facilitates a multilayer dielectric film having a desired reflectance to be realized.

Furthermore, when each of refractive indices n1 to n4 of the dielectric films 11 to 14 satisfies the relation: n2=n4≦n3≦n1, the reflective film is intended to have a reflectance of 3% to 15% at a desired wavelength by individually adjusting each thickness d1 to d4 within ±30% of range in terms of optical length. Therefore, specifications can be easily modified in accordance with applications of the laser device, and the yield of manufacturing the semiconductor laser device can be enhanced by taking the wavelength dependency and the thickness dependency into consideration.

Such a low reflective film 10 as above can be applied to a laser chip having a plurality of light emitting points which emit two or more different oscillation wavelengths, so called, a multi-beam laser, as in a pickup used for both DVD and CD.

Furthermore, in case two or more of the above semiconductor laser devices are arranged in a single package, and each of laser chip emits different oscillation wavelength from each other, and each of multilayer dielectric film on the optical exit face of each laser chip is formed of the same material with the same thickness, then, in the same manner as multi-beam laser, the reflective film is intended to have desired reflectances at desired wavelengths.

Embodiment 3

Figure 26:
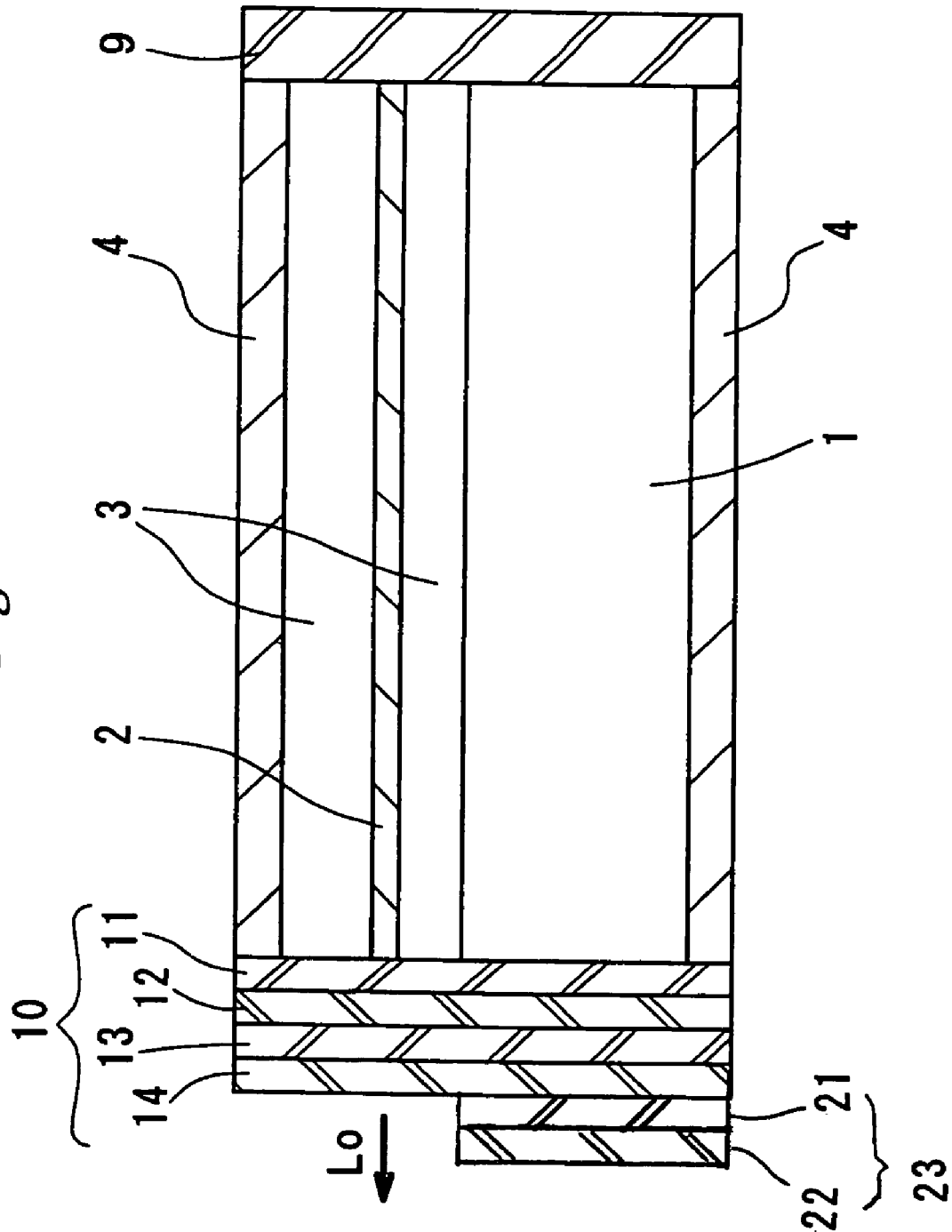
FIG. 26 is a structural drawing showing a third embodiment of the present invention.

In this embodiment, the configuration of a semiconductor laser device is similar to the embodiment shown in FIG. 1. However, in addition to the four-layered low reflectivity film as described above, in the embodiment shown in FIG. 26, the low reflectivity multilayer dielectric film 10, in combination with a fifth dielectric film 21 and a sixth dielectric film 22, which form another film 23, partly covering a region of the low reflectivity multilayer dielectric film 10, other than a light emitting point. The low reflectivity multilayer dielectric film 10 and the film 17 form another film having a lower reflectivity, that is, reflectance smaller than the reflectance of the region of the low reflectivity multilayer dielectric film 10 covering the light emitting point.

In a semiconductor laser used for optical discs, so-called, three-beam method is employed for tracking of an optical disc, where light returned from the optical disc may be irradiated to a region other than the light emitting point of the laser chip. In case a uniform reflective film is formed on an end face of the chip, reflectance of the region other than the light emitting point is the same as that of the light emitting point. Consequently, light returned from the optical disc may be reflected again by the end face of the chip to come back to the optical disc, thereby adversely affecting tracking performance of the optical pickup. Therefore, the region other than the light emitting point is preferably provided with a coating of as low reflective as possible to suppress such an adverse affect.

Then, on the optical exit faces of the laser chip, a multilayer dielectric film in combination with a fifth dielectric film and a sixth dielectric film is partly formed in the region other than the light emitting point, in addition to the four-layered low reflective film as above, so that another lower reflective film, whose reflectance is smaller than the reflectance of the region of the light emitting point, is easily obtained.

When forming two pairs of lamination layers, for example, including, sequentially from the side in contact with the four-layered low. reflective film 10, a dielectric film Q5 of a refractive index n5 and a thickness d5, a dielectric film Q6 of a refractive index n6 and a thickness d6, a dielectric film Q7 of a refractive index n7(=n5) and a thickness d7(=d5), and a dielectric film Q8 of a refractive index n8(=n6) and a thickness d8(=d6), then it is preferable that each of thicknesses d5 to d8 is substantially equal to, in terms of optical length, an integral multiple of ¼ oscillation wavelength, resulting in a sectional region with a lower reflectance.

It is preferable that the dielectric film Q5 is formed of either of $Al_2O_3$, $CeF_3$, $NdF_3$, MgO and $Y_2O_3$, the dielectric film Q6 is formed of either of $SiO_2$, $MgF_2$, $BaF_2$ and $CaF_2$, the dielectric film Q7 is formed of either of $Al_2O_3$, $CeF_3$, $NdF_3$, MgO and $Y_2O_3$, and the dielectric film Q6 is formed of either of $SiO_2$, $MgF_2$, $BaF_2$ and $CaF_2$.

Figure 18:
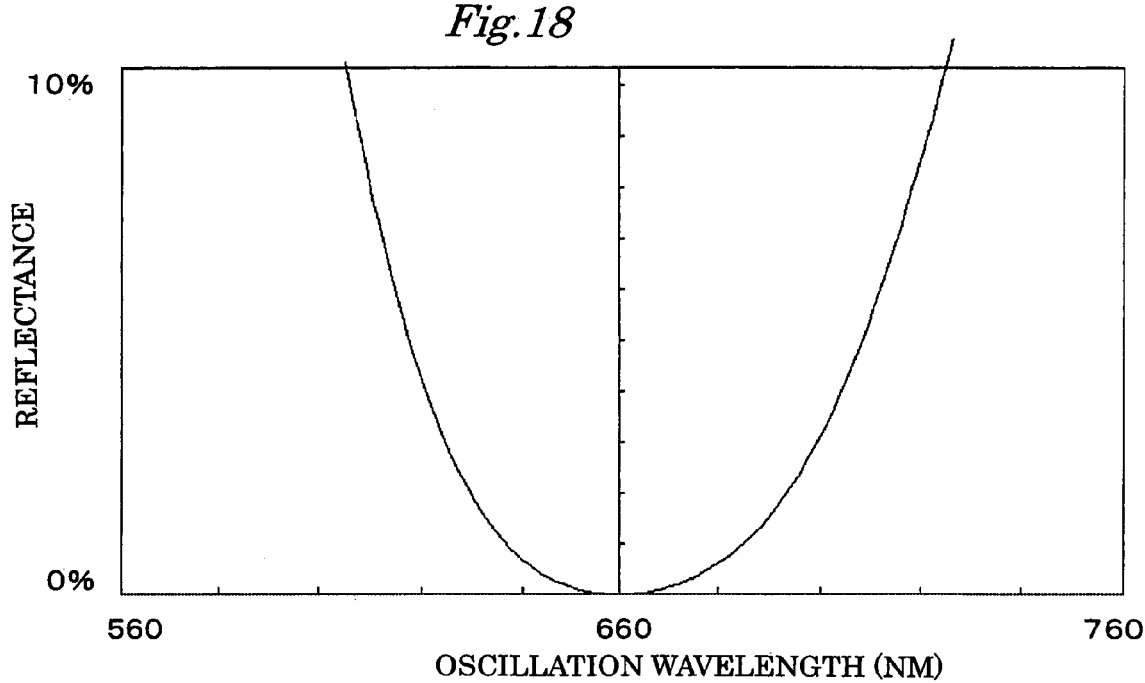
FIG. 18 is a graph showing the reflectance of an anti-reflection film with the wavelength dependency.

When additionally forming two pairs of lamination layers in the region other than the light emitting point using, for example, the dielectric film Q5 formed of a material with refractive index n5=1.640 and thickness d5=100.6 nm, the dielectric film Q6 formed of a material with refractive index n6=1.450 and thickness d6=113.8 nm, the dielectric film Q7 formed of a material with refractive index n7=1.640 and thickness d7=100.6 nm, and the dielectric film Q8 formed of a material with refractive index n8=1.450 and thickness d8=113.8 nm, respectively, then, as shown in FIG. 18, an anti-reflection film with nearly zero of reflectance at wavelength of 660 nm can be attained.

Figure 19:
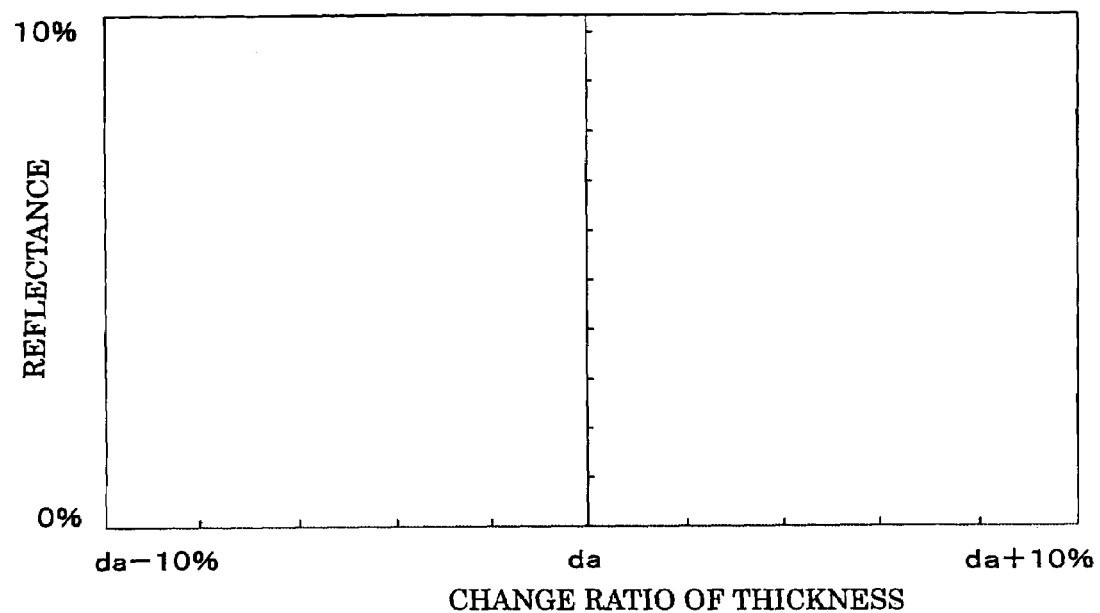
FIG. 19 is a graph showing the reflectance of the above anti-reflection film with the dependency on the thickness of the dielectric film Q5.
Figure 20:
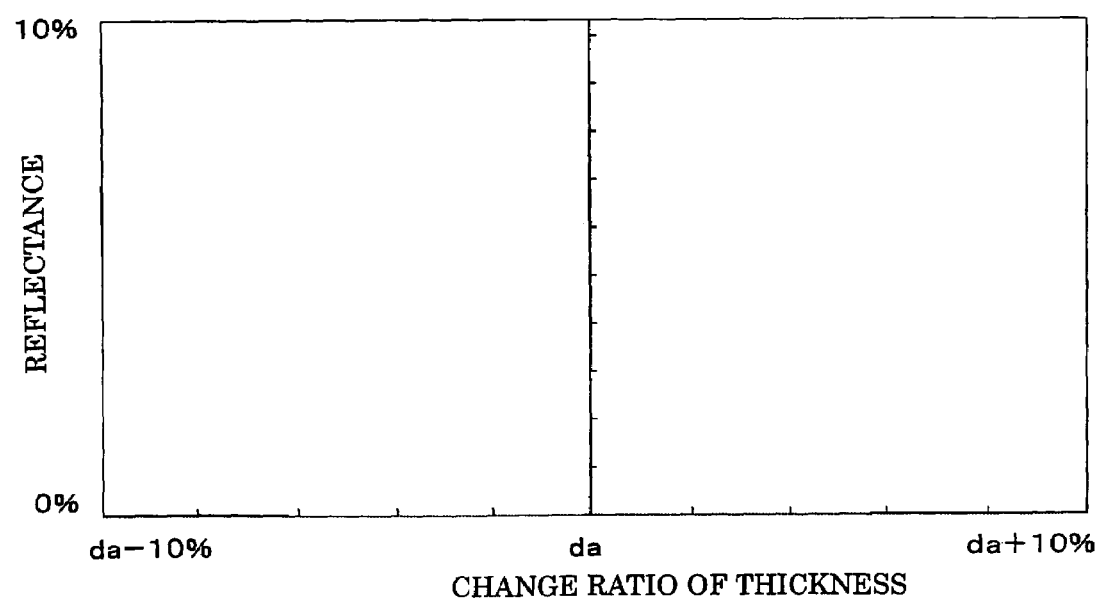
FIG. 20 is a graph showing the reflectance of the above anti-reflection film with the dependency on the thickness of the dielectric film Q6.
Figure 21:
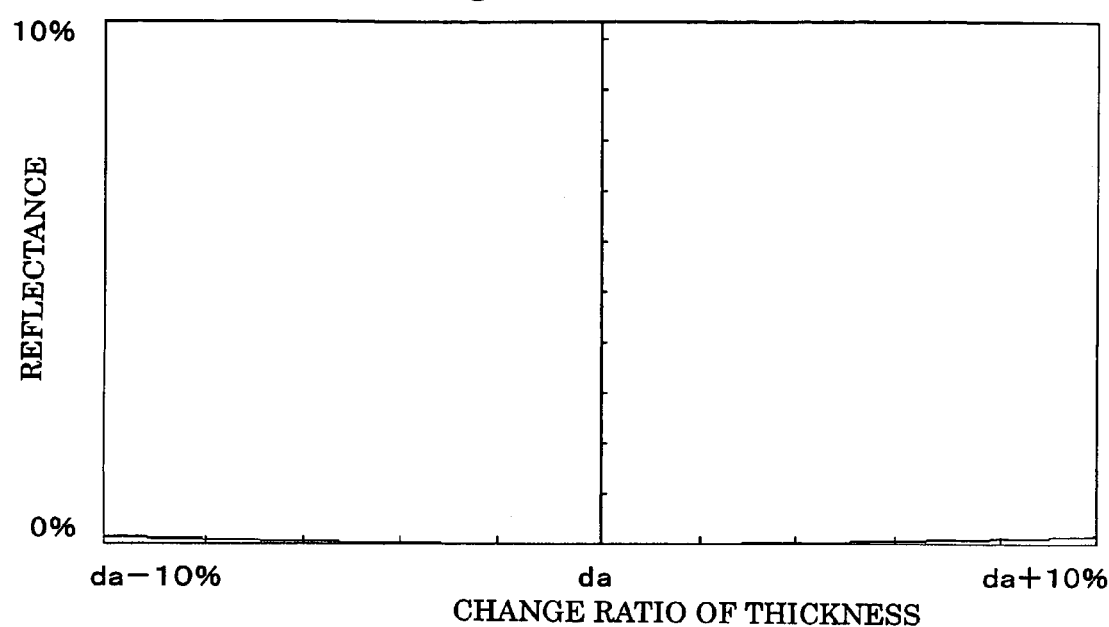
FIG. 21 is a graph showing the reflectance of the above anti-reflection film with the dependency on the thickness of the dielectric film Q7.
Figure 22:
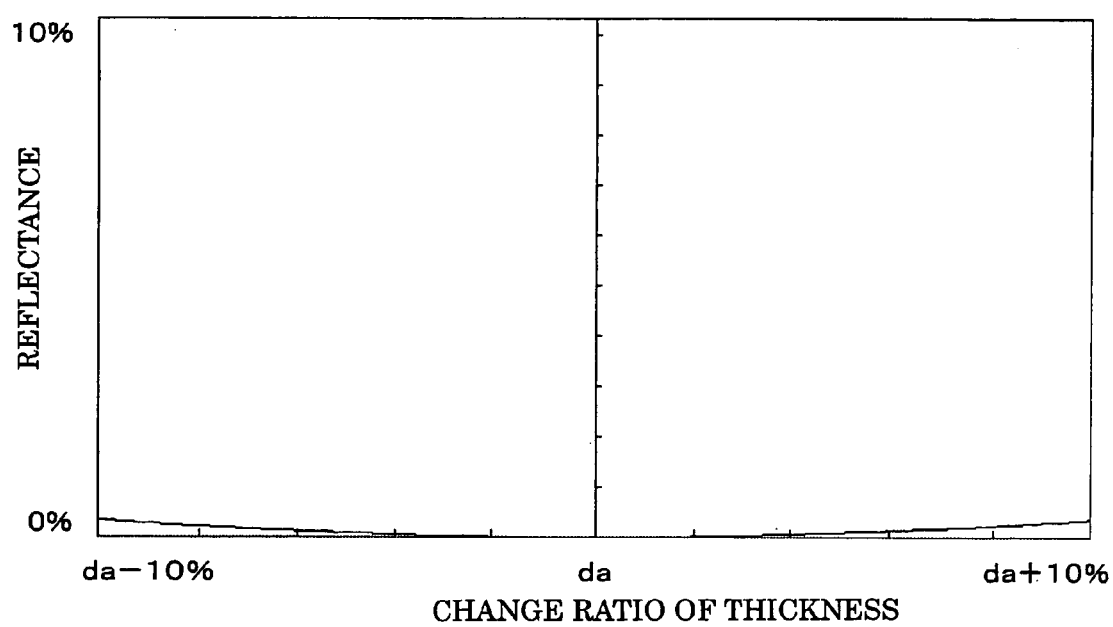
FIG. 22 is a graph showing the reflectance of the above anti-reflection film with the dependency-on the thickness of the dielectric film Q8.

FIG. 19 is a graph showing the reflectance of the above anti-reflection film with the dependency on the thickness of the dielectric film Q5. FIG. 20 is a graph showing the reflectance of the above anti-reflection film with the dependency on the thickness of the dielectric film Q6. FIG. 21 is a graph showing the reflectance of the above anti-reflection film with the dependency on the thickness of the dielectric film Q7. FIG. 22 is a graph showing the reflectance of the above anti-reflection film with the dependency on the thickness of the dielectric film Q8.

Each of these graphs shows a reflectance of 0% at each design value of thickness da, where variation of the reflectance versus change of the thickness of each dielectric film becomes significantly smaller. The reflectance of the anti-reflection film hardly changes even if each of thicknesses d5 to d8 deviates within ±10% of range with respect to each design value of thickness da. Therefore, it is seen that variation of the reflectance can be suppressed within 0.5% at most.

Incidentally, in each of the above-mentioned embodiments, the multilayer dielectric film is formed on one side of optical exit faces of a laser chip. The multilayer dielectric films according to the present invention may be formed on both end faces of the optical resonator of the laser chip.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor laser device which emits light at at least one oscillation wavelength, the laser device comprising a reflective film including a multilayer dielectric film, on at least one side of an optical exit face of a laser chip, wherein
the reflective film includes, adjacent and in sequence from a side in contact with the laser chip, a first dielectric film having a refractive index n1, a second dielectric film having a refractive index n2, a third dielectric film having a refractive index n3, and a fourth dielectric film having a refractive index n4, n2=n4<n1<n3, and the reflective film has a reflectance within a range of 3% to 15% at at least one of the oscillation wavelengths.

2. A semiconductor laser device which emits light at at least one oscillation wavelength, the laser device comprising a reflective film including a multilayer dielectric film, on at least one side of an optical exit face of a laser chip, wherein
the reflective film includes, adjacent and in sequence from a side in contact with the laser chip, a first dielectric film having a refractive index n1, a second dielectric film having a refractive index n2, a third dielectric film having a refractive index n3, and a fourth dielectric film having a refractive index n4, n2=n4<n3<n1, and the reflective film has a reflectance within a range of 3% to 15% at at least one of the oscillation wavelengths.

3. The semiconductor laser device according to claim 1, wherein each of the first, second, third, and fourth dielectric films has a thickness, in terms of optical length, within ±30% of a thickness that is an integer multiple of ¼ of the at least one oscillation wavelength of the semiconductor laser device.

4. The semiconductor laser device according to claim 2, wherein each of the first, second, third, and fourth dielectric films has a thickness, in terms of optical length, within ±30% of a thickness that is an integer multiple of ¼ of the at least one oscillation wavelength of the semiconductor laser device.

5. A semiconductor laser device which emits light at at least one oscillation wavelength, $\lambda$, comprising:
a reflective film including a multilayer dielectric film, on at least one side of optical exit faces of a laser chip, wherein
the reflective film has a reflectance of 3% to 15% and includes, in sequence from a side in contact with the laser chip, a first dielectric film of a refractive index n1 and a thickness d1, a second dielectric film of a refractive index n2 and a thickness d2, a third dielectric film of a refractive index n3 and a thickness d3, and a fourth dielectric film of a refractive index n4 and a thickness d4,
the refractive index n1 satisfies $1.6<n1\leq1.9$, the refractive index n2 satisfies $1.3\leq n2\leq1.6$, the refractive index n3 satisfies $1.9<n3\leq2.3$, and the refractive index n4 satisfies $1.3\leq n4\leq1.6$, and
the thickness d1 is substantially equal to $(2*h+1)\lambda/(4*n1)$, the thickness d2 is substantially equal to $(2*i+1)\lambda/(4*n2)$, the thickness d3 is substantially equal to $(2*j+1)\lambda/(4*n3)$, and the thickness d4 is substantially equal to $(2*k+1)\lambda/(4*n4)$, and each of h, i, j, and k is zero or a positive integer.

6. A semiconductor laser device which emits light at at least one oscillation wavelength $\lambda$, the laser device comprising:
a reflective film including a multilayer dielectric film, on at least one side of optical exit faces of a laser chip, wherein
the reflective film has a reflectance of 3% to 15% and includes, in sequence from a side in contact with the laser chip, a first dielectric film of a refractive index n1 and a thickness d1, a second dielectric film of a refractive index n2 and a thickness d2, a third dielectric film of a refractive index n3 and a thickness d3, and a fourth dielectric film of a refractive index n4 and a thickness d4,
the refractive index n1 satisfies $1.9<n1\leq2.3$, the refractive index n2 satisfies $1.3\leq n2\leq1.6$, the refractive index n3 satisfies $1.6<n3\leq1.9$, and the refractive index n4 satisfies $1.3\leq n4\leq1.6$, and
the thickness d1 is substantially equal to $(2*h+1)\lambda/(4*n1)$, the thickness d2 is substantially equal to $(2*i+1)\lambda/(4*n2)$, the thickness d3 is substantially equal to $(2*j+1)\lambda/(4*n3)$, and the thickness d4 is substantially equal to $(2*k+1)\lambda/(4*n4)$, each of h, i, j, and k is zero or a positive integer.

7. The semiconductor laser device according to claim 1, wherein the first dielectric film is selected from the group consisting of $Al_2O_3$, $CeF_3$, $NdF_3$, MgO, and $Y_2O_3$, the second and fourth dielectric films are f selected from the group consisting of $SiO_2$, $MgF_2$, $BaF_2$, and $CaF_2$, and the third dielectric film is selected from the group consisting of $Ta_2O_5$, SiO, $ZrO_2$, ZnO, TiO, $TiO_2$, ZnS, $Nb_2O_5$, $HfO_2$, and AlN.

8. The semiconductor laser device according to claim 5, wherein the first dielectric film is selected from the group consisting of $Al_2O_3$, $CeF_3$, $NdF_3$, MgO, and $Y_2O_3$, the second and fourth dielectric films are selected from the group consisting of $SiO_2$, $MgF_2$, $BaF_2$, and $CaF_2$, and the third dielectric film is selected from the group consisting of $Ta_2O_5$, SiO, $ZrO_2$, ZnO, TiO, $TiO_2$, ZnS, $Nb_2O_5$, $HfO_2$, and AlN.

9. The semiconductor laser device according to claim 2, wherein the first dielectric film is selected from the group consisting of $Ta_2O_5$, SiO, $ZrO_2$, ZnO, TiO, $TiO_2$, ZnS, $Nb_2O_5$, $HfO_2$, and AlN, the second and fourth dielectric films are selected from the group consisting of $SiO_2$, $MgF_2$, $BaF_2$, and $CaF_2$, and the third dielectric film is selected from the group consisting of $Al_2O_3$, $CeF_3$, $NdF_3$, MgO, and $Y_2O_3$.

10. The semiconductor laser device according to claim 6, wherein the first dielectric film is selected from the group consisting of $Ta_2O_5$, SiO, $ZrO_2$, ZnO, TiO, $TiO_2$, ZnS, $Nb_2O_5$, $HfO_2$, and AlN, the second and fourth dielectric films are selected from the group consisting of $SiO_2$, $MgF_2$, $BaF_2$, and $CaF_2$, and the third dielectric film is selected from the group consisting of $Al_2O_3$, $CeF_3$, $NdF_3$, MgO, and $Y_2O_3$.

11. The semiconductor laser device according to claim 1, including a fifth dielectric film and a sixth dielectric film on a first region of the reflective film, but not on a second region of the reflective film, and reflectance of the first region is smaller than reflectance of the second region.

12. The semiconductor laser device according to claim 2, including a fifth dielectric film and a sixth dielectric film on a first region of the reflective film, but not on a second region of the reflective film, and reflectance of the first region is smaller than reflectance of the second region.

13. The semiconductor laser device according to claim 11, wherein each of the fifth and sixth dielectric films has a thickness, in terms of optical length, within ±30% of range of an integral multiple of ¼ of the oscillation wavelength of the semiconductor laser device.

14. The semiconductor laser device according to claim 12, wherein each of the fifth and sixth dielectric films has a thickness, in terms of optical length, within ±30% of range of an integral multiple of ¼ of the oscillation wavelength of the semiconductor laser device.

15. The semiconductor laser device according to claim 13, wherein the fifth dielectric film is selected from the group consisting of $Al_2O_3$, $CeF_3$, $NdF_3$, MgO, and $Y_2O_3$, and the sixth dielectric film is selected from the group consisting of $SiO_2$, $MgF_2$, $BaF_2$, and $CaF_2$.

16. The semiconductor laser device according to claim 14, wherein the fifth dielectric film is selected from the group consisting of $Al_2O_3$, $CeF_3$, $NdF_3$, MgO, and $Y_2O_3$, and the sixth dielectric film is selected from the group consisting of $SiO_2$, $MgF_2$, $BaF_2$, and $CaF_2$.

17. A semiconductor laser device according to claim 1, wherein the first dielectric film is in contact with the optical exit face.

18. A semiconductor laser device according to claim 2, wherein the first dielectric film is in contact with the optical exit face.

* * * * *